United States Patent
Erickson et al.

(10) Patent No.: US 10,304,522 B2
(45) Date of Patent: May 28, 2019

(54) METHOD FOR LOW POWER OPERATION AND TEST USING DRAM DEVICE

(71) Applicant: International Business Machines Corporation, Armonk, NY (US)

(72) Inventors: Karl R. Erickson, Rochester, MN (US); Phil C. Paone, Rochester, MN (US); David P. Paulsen, Inver Grove Heights, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/420,679

(22) Filed: Jan. 31, 2017

(65) Prior Publication Data
US 2018/0218766 A1    Aug. 2, 2018

(51) Int. Cl.
*G11C 29/50* (2006.01)
*G11C 11/4094* (2006.01)
*G11C 7/12* (2006.01)
*G11C 11/408* (2006.01)
*G11C 29/12* (2006.01)

(52) U.S. Cl.
CPC ............ *G11C 11/4094* (2013.01); *G11C 7/12* (2013.01); *G11C 29/50* (2013.01); *G11C 11/4087* (2013.01); *G11C 2029/1204* (2013.01); *G11C 2029/5002* (2013.01); *G11C 2029/5004* (2013.01)

(58) Field of Classification Search
CPC .............. G11C 11/4094; G11C 11/406; G11C 11/4087
See application file for complete search history.

(56) References Cited

U.S. PATENT DOCUMENTS

| | | |
|---|---|---|
| 3,076,933 A | 2/1963 | Negrete |
| 4,561,089 A | 12/1985 | Rouse et al. |
| 4,800,518 A | 1/1989 | Miller |
| 4,802,103 A | 1/1989 | Faggin et al. |
| 5,376,915 A | 12/1994 | Takeuchi et al. |

(Continued)

OTHER PUBLICATIONS

AUS920160602US1, Appendix P; List of IBM Patent or Applications Treated as Related, Jun. 8, 2017, 2 pages.

(Continued)

*Primary Examiner* — Mushfique Siddique
(74) *Attorney, Agent, or Firm* — Nathan M. Rau (57) ABSTRACT

Big data analysis using low power circuit design including storing a plurality of data bits in a plurality of cells on a bitline of a dynamic random access memory (DRAM), wherein each data bit corresponds to a test result, and wherein each of the plurality of cells on the bitline is associated with a different wordline; precharging the bitline to a midpoint voltage between a low voltage corresponding to a low data bit and a high voltage corresponding to a high data bit; activating, at the same time, each wordline associated with each of the plurality of cells on the bitline, wherein activating each wordline causes a voltage to be applied to the bitline from each of the plurality of cells; and measuring a resulting voltage on the bitline to obtain a value corresponding to a percentage of the test results that indicate a passing test result.

15 Claims, 7 Drawing Sheets

(56) References Cited

U.S. PATENT DOCUMENTS

| | | | |
|---|---|---|---|
| 5,497,121 A | 3/1996 | D'Hont | |
| 5,768,501 A | 6/1998 | Lewis | |
| 6,081,468 A | 6/2000 | Taira et al. | |
| 6,130,568 A | 10/2000 | Kwon et al. | |
| 6,154,864 A * | 11/2000 | Merritt | G11C 7/10 365/201 |
| 6,982,431 B2 | 1/2006 | Modlin et al. | |
| 7,084,695 B2 | 8/2006 | Porter | |
| 7,111,260 B2 | 9/2006 | Visweswariah | |
| 7,139,743 B2 | 11/2006 | Indeck et al. | |
| 8,909,592 B2 | 12/2014 | Stergiou et al. | |
| 9,000,837 B1 | 4/2015 | Fifield | |
| 9,082,495 B2 | 7/2015 | Lee et al. | |
| 9,093,175 B2 | 7/2015 | Barth, Jr. et al. | |
| 9,147,144 B2 | 9/2015 | Potyrailo et al. | |
| 9,147,457 B2 | 9/2015 | Kim et al. | |
| 9,367,853 B2 | 6/2016 | Cronin et al. | |
| 9,411,009 B1 | 8/2016 | Aguayo Gonzalez et al. | |
| 9,478,303 B1 | 10/2016 | Parker | |
| 9,508,424 B2 | 11/2016 | Lee | |
| 9,916,890 B1 * | 3/2018 | Erickson | G11C 11/419 |
| 10,037,792 B1 | 7/2018 | Erickson et al. | |
| 10,043,568 B1 | 8/2018 | Erickson et al. | |
| 2002/0159319 A1 * | 10/2002 | Kirihata | G11C 7/22 365/203 |
| 2007/0070754 A1 * | 3/2007 | Vogelsang | G11C 7/12 365/208 |
| 2008/0313510 A1 * | 12/2008 | Baker | G11C 11/5678 714/718 |
| 2010/0182859 A1 * | 7/2010 | Kohler | G11C 8/08 365/201 |
| 2014/0063915 A1 * | 3/2014 | Cronie | G11C 7/1006 365/149 |
| 2014/0122925 A1 | 5/2014 | Peake et al. | |
| 2014/0201426 A1 | 7/2014 | Ma | |
| 2014/0293715 A1 * | 10/2014 | Barth, Jr. | G11C 7/067 365/189.11 |
| 2015/0016193 A1 | 1/2015 | Lewis et al. | |
| 2015/0281612 A1 | 10/2015 | Lund et al. | |
| 2017/0220918 A1 | 8/2017 | Entner | |
| 2018/0240512 A1 | 8/2018 | Erickson et al. | |

OTHER PUBLICATIONS

Kozma et al., *A Low-Power Current-Mode Correlation Detector with Analog Data Storage*, 2004 IEEE Region 10 Conference (TENCON 2004), Nov. 2004, vol. 2, pp. 442-445, IEEE Xplore Digital Library (ieee.org) online, DOI: 10.1109/TENCON.2004.1414627, URL: ieeexplore.ieee.org/abstract/document/1414627/.

*Voltage Comparator, Chapter 6—Analog Integrated Circuits*, All About Circuits, Electronics Textbook, <https://www.allaboutcircuits.com/textbook/experiments/chpt-6/voltage-comparator/>, EETech Media, LLC, printed Mar. 10, 2017, 3 pages.

J. Carstens, *Open Bit Line Sensing: Writing Dummy Cells for Test Purpose*, An IP.com Prior Art Database Technical Disclosure, IP.com No. IPCOM000174809D, Qimonda 2008, Original Publication Date: Oct. 13, 2008, 2 pages.

U.S. Appl. No. 15/437,482, to Karl R. Erickson et al., entitled, *Predicting Data Correlation Using Multivalued Logical Outputs in Static Random Access Memory (SRAM) Storage Cells*, assigned to International Business Machines Corporation, 29 pages, filed Feb. 21, 2017.

U.S. Appl. No. 15/612,272, to Karl R. Erickson et al., entitled, *Real Time Cognitive Reasoning Using a Circuit With Varying Confidence Level Alerts*, assigned to International Business Machines Corporation, 41 pages, filed Jun. 2, 2017.

U.S. Appl. No. 15/612,360, to to Karl R. Erickson et al., entitled, *Cognitive Analysis Using Applied Analog Circuits*, assigned to International Business Machines Corporation, 37 pages, filed Jun. 2, 2017.

U.S. Appl. No. 15/612,433, to to Karl R. Erickson et al., entitled, *Real Time Cognitive Monitoring of Correlations Between Variables*, assigned to International Business Machines Corporation, 41 pages, filed Jun. 2, 2017.

U.S. Appl. No. 15/612,316, to to Karl R. Erickson et al., entitled, *Optimizing Data Approximation Analysis Using Low Power Circuitry*, assigned to International Business Machines Corporation, 34 pages, filed Jun. 2, 2017.

U.S. Appl. No. 15/892,037, to Karl R. Erickson et al., entitled, *Predicting Data Correlation Using Multivalued Logical Outputs in Static Random Access Memory (SRAM) Storage Cells*, assigned to International Business Machines Corporation, 24 pages, filed Feb. 28, 2018.

U.S. Appl. No. 15/822,479, to Karl R. Erickson et al., entitled, *Optimizing Data Approximation Analysis Using Low Power Circuitry*, assigned to International Business Machines Corporation, 28 pages, filed Nov. 27, 2017.

U.S. Appl. No. 15/820,301, to Karl R. Erickson et al., entitled, *Real Time Cognitive Monitoring of Correlations Between Variables*, assigned to International Business Machines Corporation, 34 pages, filed Nov. 21, 2017.

U.S. Appl. No. 15/818,929, to Karl R. Erickson et al., entitled, *Cognitive Analysis Using Applied Analog Circuits*, assigned to International Business Machines Corporation, 31 pages, filed Nov. 21, 2017.

U.S. Appl. No. 15/818,977, to Karl R. Erickson et al., entitled, *Real Time Cognitive Reasoning Using a Circuit With Varying Confidence Level Alerts*, assigned to International Business Machines Corporation, 36 pages, filed Nov. 21, 2017.

AUS920160602US1, Appendix P; List of Patents or Applications Treated as Related, Feb. 27, 2018, 2 pages.

U.S. Appl. No. 16/000,207, to Karl R. Erickson et al., entitled, *Optimizing Data Approximation Analysis Using Low Power Circuitry*, assigned to International Business Machines Corporation, 34 pages, filed Jun. 5, 2018.

U.S. Appl. No. 16/001,420, to to Karl R. Erickson et al., entitled, *Optimizing Data Approximation Analysis Using Low Power Circuitry*, assigned to International Business Machines Corporation, 34 pages, filed Jun. 6, 2018.

AUS920160602US1, Appendix P; List of IBM Patent or Applications Treated as Related, Sep. 14, 2018, 2 pages.

\* cited by examiner

METHOD FOR LOW POWER OPERATION AND TEST USING DRAM DEVICE

BACKGROUND

Field of the Invention

The field of the invention is data processing, or, more specifically, methods, apparatus, and products for big data analysis using low power circuit design.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for big data analysis using low power circuit design are disclosed in this specification. Big data analysis using low power circuit design includes storing a plurality of data bits in a plurality of cells on a bitline of a dynamic random access memory (DRAM), wherein each data bit corresponds to a test result, and wherein each of the plurality of cells on the bitline is associated with a different wordline; precharging the bitline to a midpoint voltage between a low voltage corresponding to a low data bit and a high voltage corresponding to a high data bit; activating, at the same time, each wordline associated with each of the plurality of cells on the bitline, wherein activating each wordline causes a voltage to be applied to the bitline from each of the plurality of cells; and measuring a resulting voltage on the bitline to obtain a value corresponding to a percentage of the test results that indicate a passing test result.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
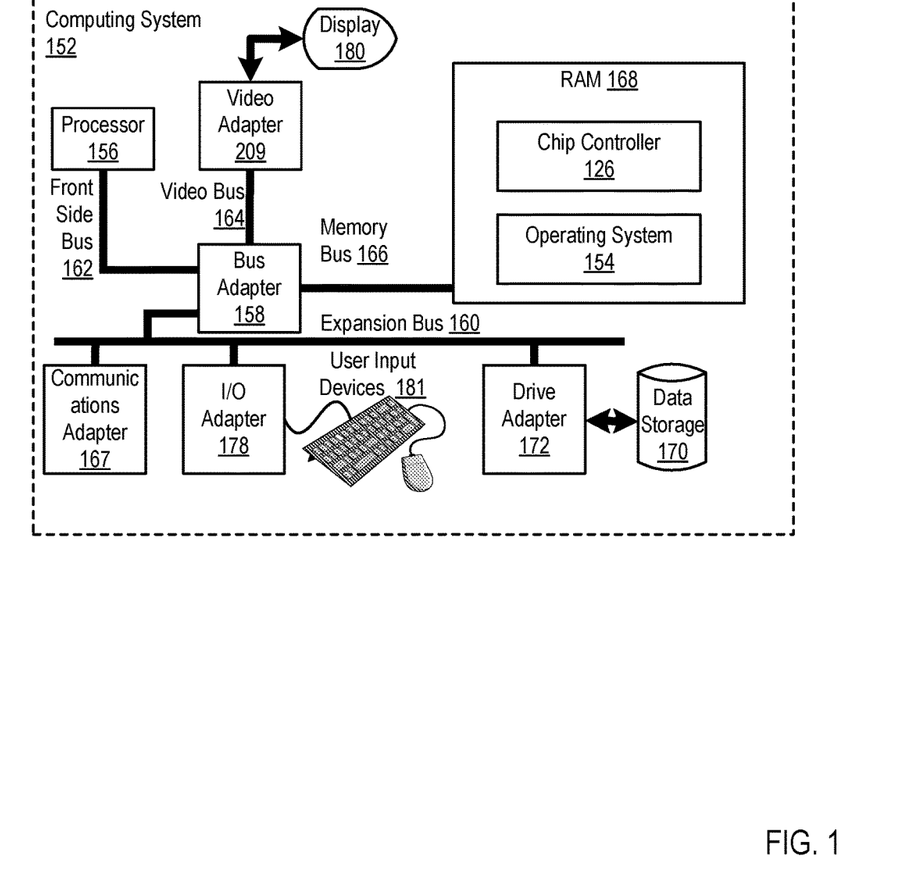
FIG. 1 sets forth a block diagram of an example system configured for big data analysis using low power circuit design according to embodiments of the present invention.

Exemplary methods, apparatus, and products for big data analysis using low power circuit design in accordance with the present invention are described with reference to the accompanying drawings, beginning with FIG. 1. FIG. 1 sets forth a block diagram of automated computing machinery comprising an exemplary computing system (152) configured for big data analysis using low power circuit design according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for big data analysis using low power circuit design according to embodiments of the present invention include UNIX™, Linux™, Microsoft XP™, AIX™, IBM's i OS™, and others as will occur to those of skill in the art. The operating system (154) in the example of FIG. 1 is shown in RAM (168), but many components of such software typically are stored in non-volatile memory also, such as, for example, on a disk drive (170). Also stored in RAM (168) is a chip controller (126), a module of computer program instructions for big data analysis using low power circuit design.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of data storage (170). Disk drive adapters useful in computers configured for big data analysis using low power circuit design according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for big data analysis using low power circuit design according to embodiments of the present invention include modems for wired dial-up communications, Ethernet (IEEE 802.3) adapters for wired data communications, and 802.11 adapters for wireless data communications.

Figure 2:
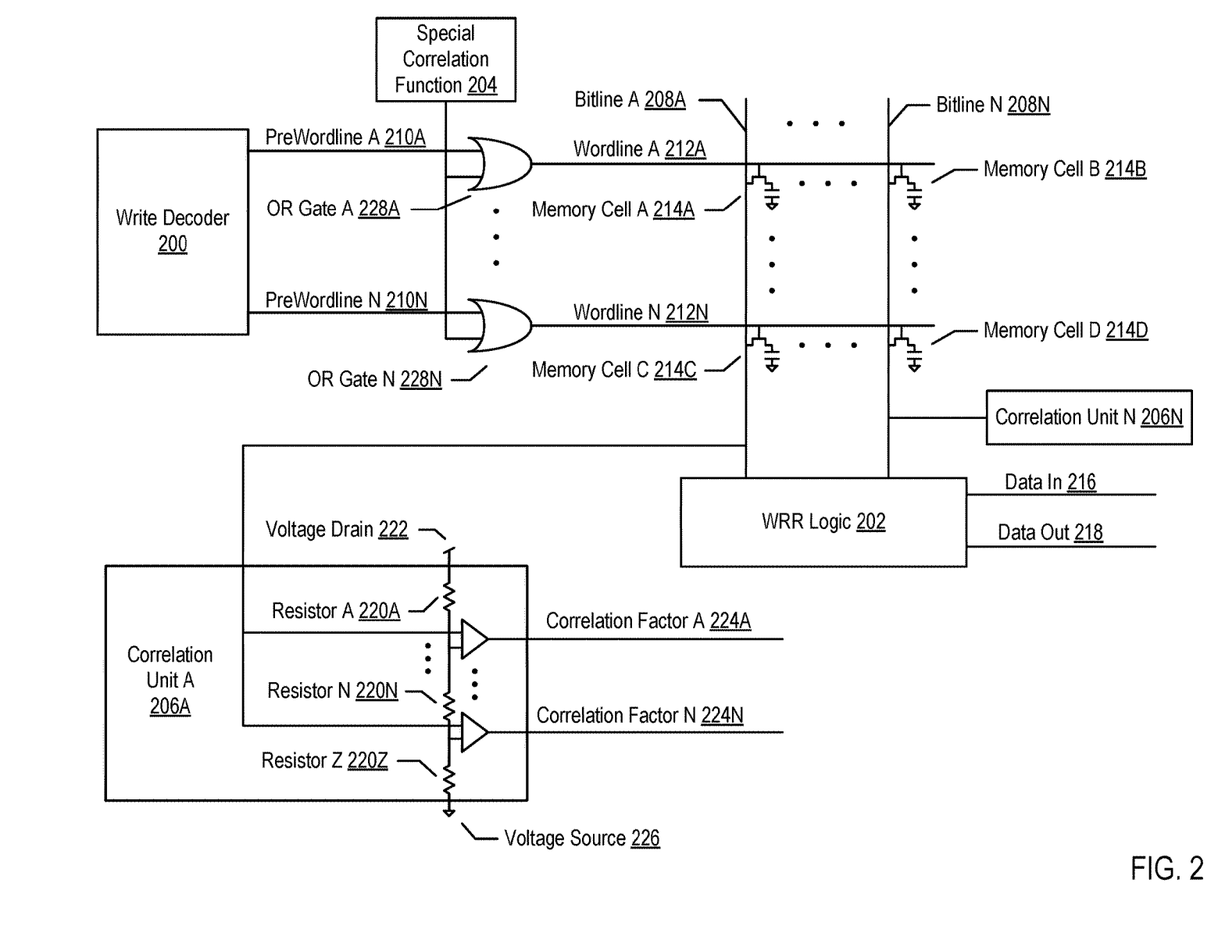
FIG. 2 sets forth an electronic chip configured for big data analysis using low power circuit design according to embodiments of the present invention.

FIG. 2 shows elements of a dynamic random access memory (DRAM) configured for big data analysis using low power circuit design in accordance with the present invention. As shown in FIG. 2, FIG. 2 includes a write decoder (200), a write-read-refresh (WRR) logic (202), a special correlation function (204), and multiple correlation units (correlation unit A (206A), correlation unit N (206N)). The DRAM of FIG. 2 includes multiple memory cells (memory cell A (214A), memory cell B (214B), memory cell C (214C), memory cell D (214D)), each operatively connected to one wordline (wordline A (212A), wordline N (212N)) and one bitline (bitline A (208A), bitline N (208N)). Each bitline (bitline A (208A), bitline N (208N)) is operatively connected to the WRR logic (202). Although only two prewordlines, wordlines, and bitlines are shown, the DRAM may include many prewordlines, wordlines, and bitlines, and many memory cells on each wordline and bitline.

Data bits are stored in the memory cells (memory cell A (214A), memory cell B (214B), memory cell C (214C), memory cell D (214D)) by placing, via the data in (216), the data bit on a bitline (bitline A (208A), bitline N (208N)) for the memory cell and activating the corresponding wordline (wordline A (212A), wordline N (212N)) using the write decoder (200). Each wordline (wordline A (212A), wordline N (212N)) may be activated by the write decoder (200) via the prewordlines (prewordline A (210A), prewordline N (210N)). Each wordline (wordline A (212A), wordline N (212N)) may also be activated by the special correlation function (204). Data may be read from the memory cells using the data out (218).

The WRR logic (202) may also include functionality to refresh the memory cells (memory cell A (214A), memory cell B (214B), memory cell C (214C), memory cell D (214D)). The data bits stored in the memory cells may degrade and lose voltage over time. In order to maintain the voltage in each memory cell as close to ideal as possible, the memory cells may be periodically refreshed by adding an amount of voltage to each memory cell.

The special correlation function (204) is logic within the DRAM or located outside the DRAM that is configured to activate all connected wordlines at the same time, causing each memory cell on a bitline to apply a voltage to the bitline. The term "at the same time" as used herein refers to an intent to perform a group of actions simultaneously or nearly simultaneously. The special correlation function (204) is operatively connected to the wordlines (wordline A (212A), wordline N (212N)) via OR gates (OR gate A (228A), OR gate N (228N)) such that each wordline (wordline A (212A), wordline N (212N)) may be activated by either the write decoder (200) or by the special correlation function (204) along with each other wordline.

The correlation units (correlation unit A (206A), correlation unit N (206N)) are each operatively connected to a bitline (bitline A (208A), bitline N (208N)) and are configured to determine a percentage of data bits within the memory cells on the bitline that are high (i.e., "1"). The correlation units (correlation unit A (206A), correlation unit N (206N)) include an analog-to-digital converter that includes multiple resistors (resistor A (220A), resistor N (220N), resistor Z (220Z)) and correlation factors (correlation factor A (224A), correlation factor N (224N)). The resulting voltage received from the bitline is placed on a power rail (between voltage drain (222) and voltage source (226)) separated by the resistors and amplified for each correlation factor. Depending on the voltage received, zero, one, multiple, or all correlation factors may be activated. For example, the correlation unit may include four correlation factors corresponding to the percentage values 10%, 20%, 80%, and 90%.

A chip controller (not shown) may be logic within the DRAM or operatively connected to the DRAM with functionality to operate the DRAM chip for big data analysis. Specifically, the chip controller may include functionality to store a plurality of data bits in a plurality of cells on a bitline of a dynamic random access memory (DRAM), wherein each data bit corresponds to a test result, and wherein each of the plurality of cells on the bitline is associated with a different wordline; precharge the bitline to a midpoint voltage between a low voltage corresponding to a low data bit and a high voltage corresponding to a high data bit; activate, at the same time, each wordline associated with each of the plurality of cells on the bitline, wherein activating each wordline causes a voltage to be applied to the bitline from each of the plurality of cells; and measure a resulting voltage on the bitline to obtain a value corresponding to a percentage of the test results that indicate a passing test result.

Figure 3:
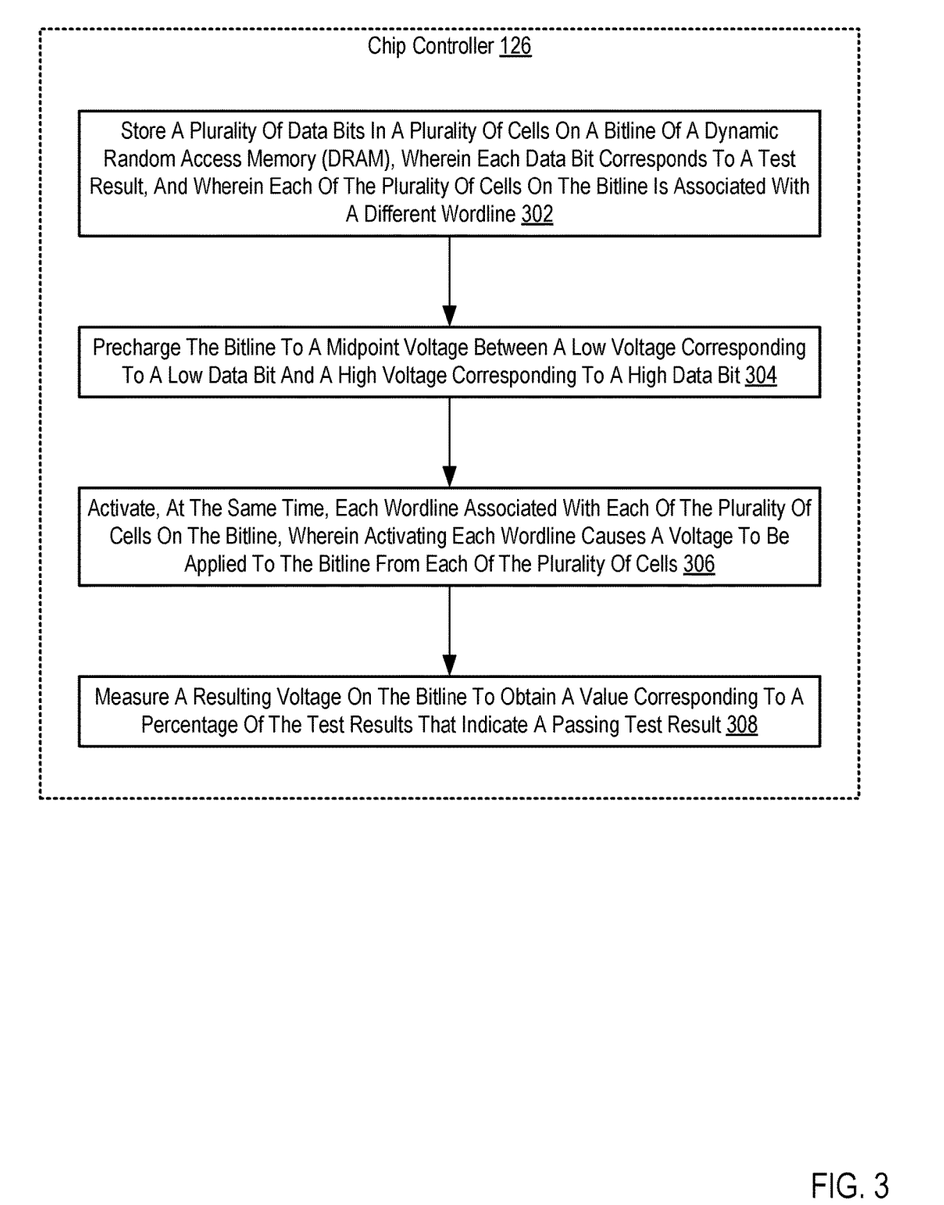
FIG. 3 sets forth a flow chart illustrating an exemplary method for big data analysis using low power circuit design according to embodiments of the present invention.

For further explanation, FIG. 3 sets forth a flow chart illustrating an exemplary method for big data analysis using low power circuit design according to embodiments of the present invention. The method of FIG. 3 includes storing (302) a plurality of data bits in a plurality of cells on a bitline of a dynamic random access memory (DRAM), wherein each data bit corresponds to a test result, and wherein each of the plurality of cells on the bitline is associated with a different wordline. Storing (302) a plurality of data bits in a plurality of cells on a bitline of a dynamic random access memory (DRAM), wherein each data bit corresponds to a test result, and wherein each of the plurality of cells on the bitline is associated with a different wordline may be carried out by selecting, via the write decoder, a wordline to activate, and placing the data bit, via the WRR logic, on a bitline causing the data bit to be stored at the memory cell operatively connected to both the selected wordline and the bitline.

A set of data bits may be stored on a set of memory cells as part of a single operation. Specifically, a wordline may be selected and the set of data bits may be placed on a bus corresponding to a group of bitlines. Each data bit of the set of data bits may then be stored in different memory cells on the same wordline.

Each data bit may correspond to a test result. Specifically, each data bit may represent either that a test was passed (e.g., a "1") or a test was failed (e.g., a "0"). For example, during computer chip manufacturing, a test result may indicate whether a chip component operated in accordance with a design specification.

A set of data bits, as described above, may correspond to a group of tests results for different tests performed under the same conditions. For example, a computer chip may be tested after manufacture. A set of tests may be performed on each non-yielding chip to determine whether individual components of the chip perform in accordance with the design specification. A set of data bits representing the results of each test may be stored in the memory cells on the same wordline, with each memory cell on each bitline representing the results of a different test. Subsequent test results for subsequent computer chips may be stored on the memory cells of subsequent wordlines such that each memory cell on a given bitline stores the test results for the same test performed on different non-yielding computer chips. In this case, different tests under the same conditions refer to different tests performed on the same non-yielding computer chip.

The method of FIG. 3 also includes precharging (304) the bitline to a midpoint voltage between a low voltage corresponding to a low data bit and a high voltage corresponding to a high data bit. Precharging (304) the bitline to a midpoint voltage between a low voltage corresponding to a low data bit and a high voltage corresponding to a high data bit may be carried out by the WRR logic adjusting a voltage on the bitline by either adding or removing voltage from the bitline. Precharging (304) the bitline provides a baseline that allows the resulting voltage applied by the memory cells to be accurately measured.

The method of FIG. 3 also includes activating (306), at the same time, each wordline associated with each of the plurality of cells on the bitline, wherein activating each wordline causes a voltage to be applied to the bitline from each of the plurality of cells. Activating (306), at the same time, each wordline associated with each of the plurality of cells on the bitline, wherein activating each wordline causes a voltage to be applied to the bitline from each of the plurality of cells may be carried out by sending an activation signal to each wordline at the same time. Such an activation signal may be sent by a special correlation function attached to each wordline of the DRAM or each wordline storing the relevant data bits.

The method of FIG. 3 also includes measuring (308) a resulting voltage on the bitline to obtain a value corresponding to a percentage of the test results that indicate a passing test result. Measuring (308) a resulting voltage on the bitline to obtain a value corresponding to a percentage of the test results that indicate a passing test result may be carried out by obtaining the resulting voltage and comparing that voltage to the midpoint voltage precharged on the bitline to determine the percentage deviation from the midpoint For example, a set of test results for non-yielding chips may be stored in the memory cells such that each memory cell on a bitline stores test results for the same test performed on different non-yielding chips, and each memory cell on a wordline stores test results for different tests performed on the same non-yielding chip. Once all data bits are stored in the memory cells, the bitlines are precharged and all wordlines are activated at the same time. The resulting voltage on each bitline is then measured to obtain a value corresponding to the percentage of the test results that indicate a passing test result.

Continuing with the example, the first bitline may include memory cells that store the test results for a contact via (CA) resistance test. Assume that 256 test results have been stored in the memory cells on the bitline. Assume further that 205 of those test results are up (i.e., "1"), and 51 of those test results are down (i.e., "0"). Once each wordline has been activated, a voltage that is 80% of the maximum expected voltage on the bitline would be measured, indicating that 80% of the CA resistance tests passed for the set of non-yielding chips.

Because computer chip manufacturing is performed with continuous output requirements, efficiently evaluating the test results from yielding and non-yielding chips is imperative to quickly making changes to the process to improve those yields. Using a modified DRAM chip and the process described above, the test results can be evaluated quickly and efficiently to determine relevant factors that may lead to changes to the manufacturing process (in the case of non-yielding chips) or the testing process (in the case of yielding chips).

Figure 4:
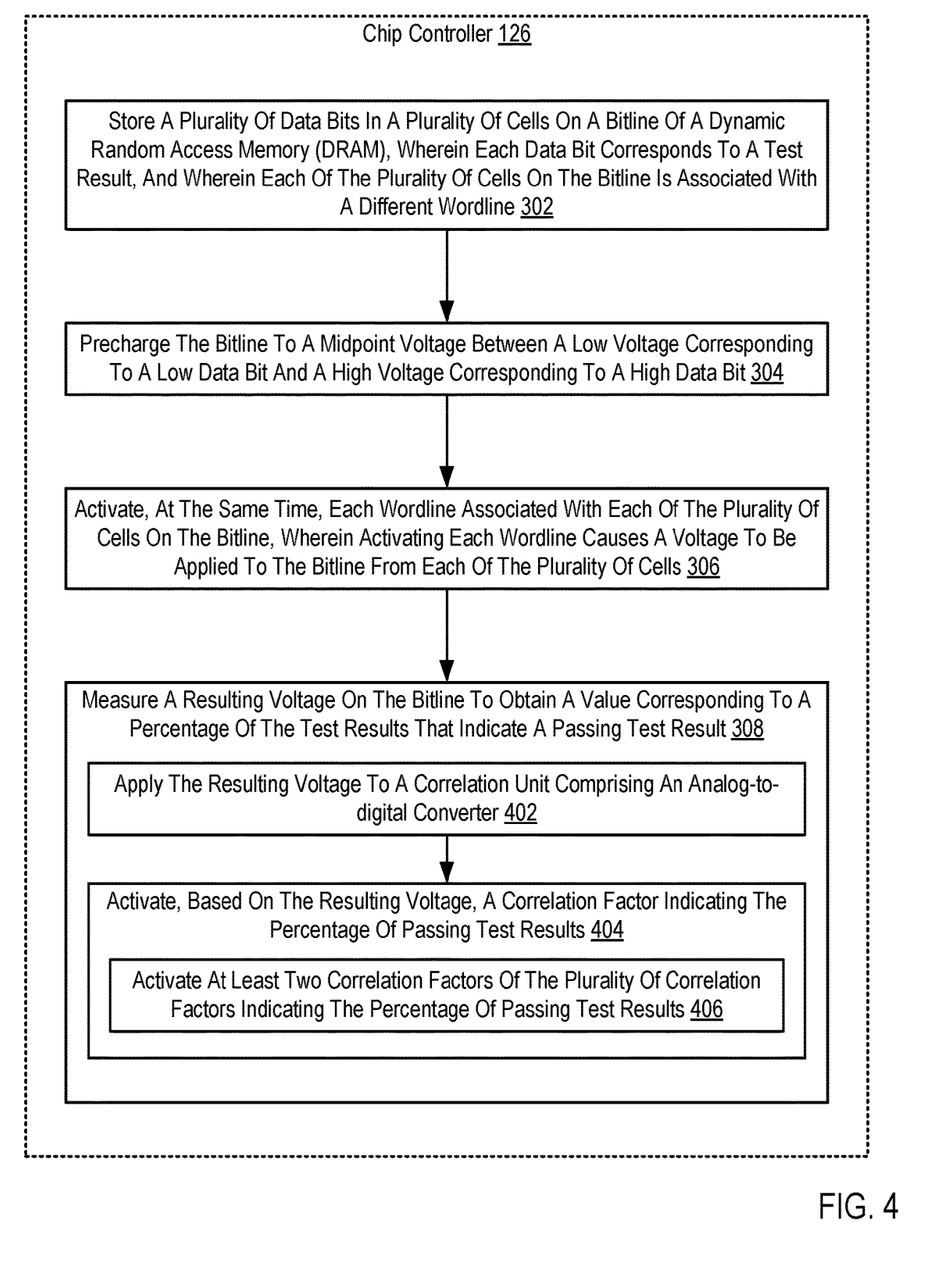
FIG. 4 sets forth a flow chart illustrating an exemplary method for big data analysis using low power circuit design according to embodiments of the present invention.

For further explanation, FIG. 4 sets forth a flow chart illustrating an exemplary method for big data analysis using low power circuit design according to embodiments of the present invention that includes storing (302) a plurality of data bits in a plurality of cells on a bitline of a dynamic random access memory (DRAM), wherein each data bit corresponds to a test result, and wherein each of the plurality of cells on the bitline is associated with a different wordline; precharging (304) the bitline to a midpoint voltage between a low voltage corresponding to a low data bit and a high voltage corresponding to a high data bit; activating (306), at the same time, each wordline associated with each of the plurality of cells on the bitline, wherein activating each wordline causes a voltage to be applied to the bitline from each of the plurality of cells; and measuring (308) a resulting voltage on the bitline to obtain a value corresponding to a percentage of the test results that indicate a passing test result.

The method of FIG. 4 differs from the method of FIG. 3, however, in that measuring (308) a resulting voltage on the bitline to obtain a value corresponding to a percentage of the test results that indicate a passing test result includes applying (402) the resulting voltage to a correlation unit comprising an analog-to-digital converter; and activating (404), based on the resulting voltage, a correlation factor indicating the percentage of passing test results.

Applying (402) the resulting voltage to a correlation unit comprising an analog-to-digital converter may be carried out by a correlation unit, operatively connected to the bitline, capable of obtaining a resulting voltage from the bitline once each wordline for the memory cells on the bitline has been activated. The analog-to-digital converter may convert the resulting voltage into a digital signal, such as an indication (e.g., on a correlation factor line) of whether the percentage of passing test results is above or below a specified percentage. For example, a correlation unit may be configured to indicate whether the input resulting voltage is above the expected voltage when 80% of the cells contain passing results. If a resulting voltage indicates only 60% passing test results, the correlation factor line may output a low bit (i.e., a "0"). If a resulting voltage indicates 90% passing test results, the correlation factor line may output a high bit (i.e., a "1").

Activating (404), based on the resulting voltage, a correlation factor indicating the percentage of passing test results may include activating (406) at least two correlation factors of the plurality of correlation factors indicating the percentage of passing test results. Activating (406) at least two correlation factors of the plurality of correlation factors indicating the percentage of passing test results may be carried out by a correlation unit operatively connected to the bitline capable of obtaining a resulting voltage from the bitline once each wordline for the memory cells on the bitline has been activated and indicating a digital result on at least two correlation factors. The analog-to-digital converter may convert the resulting voltage into multiple digital signals, such as multiple correlation factor lines that each indicate whether the percentage of passing test results is above or below a specified percentage for that correlation factor line.

For example, a correlation unit may include correlation factor lines that indicate whether the input resulting voltage is above the voltage correlated to 10%, 20%, 80%, and 90% passing tests. If a resulting voltage indicates only 60% passing test results, the 10% correlation factor line and the 20% correlation factor line may each output a high bit (i.e., a "1"), and the 80% correlation factor line and the 90% correlation factor line may each output a low bit (i.e., a "0"). If a resulting voltage indicates 95% passing test results, each correlation factor line may output a high bit (i.e., a "1").

Figure 5:
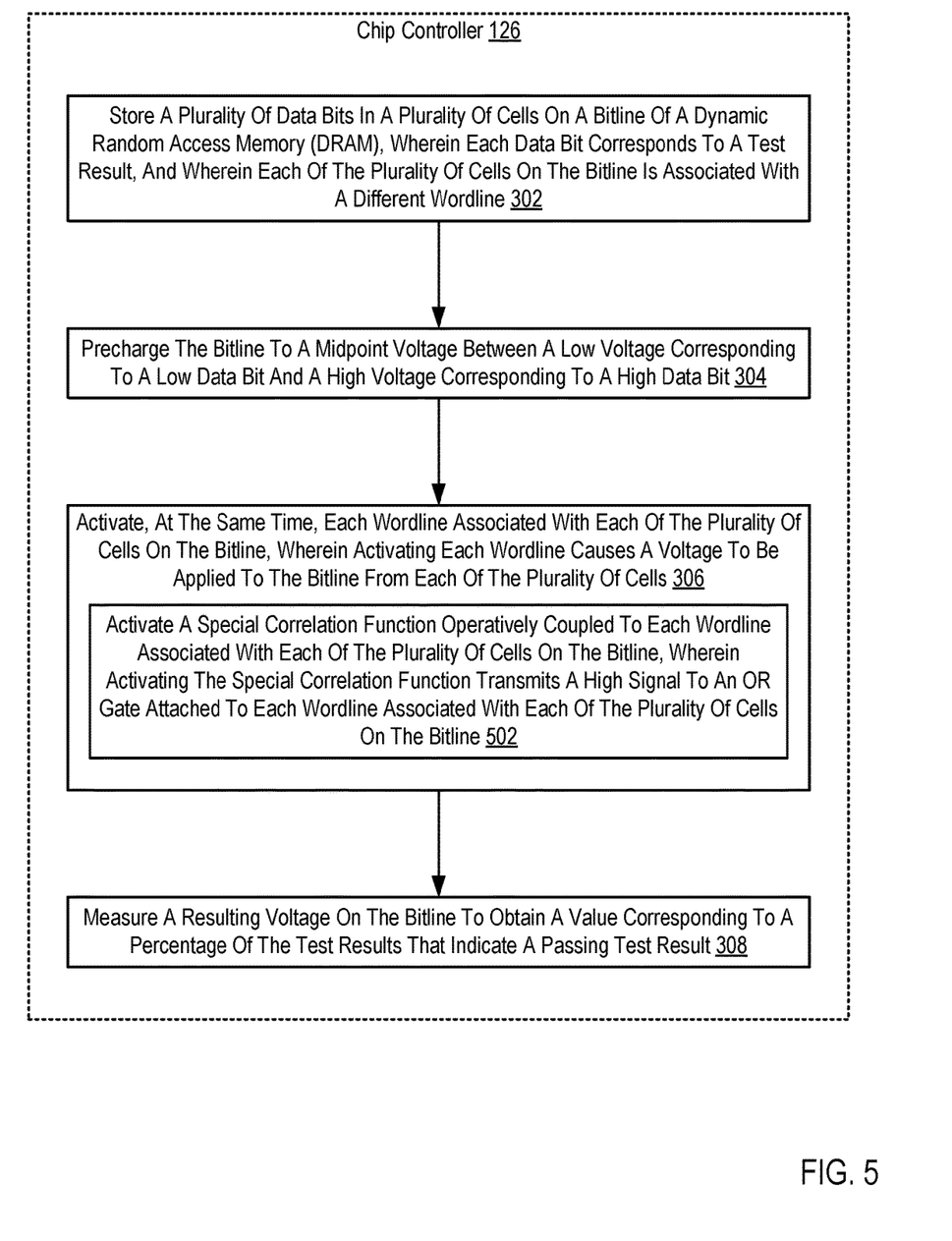
FIG. 5 sets forth a flow chart illustrating an exemplary method for big data analysis using low power circuit design according to embodiments of the present invention.

For further explanation, FIG. 5 sets forth a flow chart illustrating an exemplary method for big data analysis using low power circuit design according to embodiments of the present invention that includes storing (302) a plurality of data bits in a plurality of cells on a bitline of a dynamic random access memory (DRAM), wherein each data bit corresponds to a test result, and wherein each of the plurality of cells on the bitline is associated with a different wordline; precharging (304) the bitline to a midpoint voltage between a low voltage corresponding to a low data bit and a high voltage corresponding to a high data bit; activating (306), at the same time, each wordline associated with each of the plurality of cells on the bitline, wherein activating each wordline causes a voltage to be applied to the bitline from each of the plurality of cells; and measuring (308) a resulting voltage on the bitline to obtain a value corresponding to a percentage of the test results that indicate a passing test result.

The method of FIG. 5 differs from the method of FIG. 3, however, in that activating (306), at the same time, each wordline associated with each of the plurality of cells on the bitline, wherein activating each wordline causes a voltage to be applied to the bitline from each of the plurality of cells includes activating (502) a special correlation function operatively coupled to each wordline associated with each of the plurality of cells on the bitline, wherein activating the special correlation function transmits a high signal to an OR gate attached to each wordline associated with each of the plurality of cells on the bitline.

Activating (502) a special correlation function operatively coupled to each wordline associated with each of the plurality of cells on the bitline, wherein activating the special correlation function transmits a high signal to an OR gate attached to each wordline associated with each of the plurality of cells on the bitline may be carried out by sending a signal using the special correlation function to activate each wordline at the same time.

The special correlation function is logic within the DRAM or located outside the DRAM that is configured to activate all connected wordlines at the same time, causing each memory cell on a bitline to apply a voltage to the bitline at the same time such that the resulting voltage on the bitline may be compounded by each individual voltage applied by each memory cell. The special correlation function may be operatively connected to the wordlines via OR gates.

Figure 6:
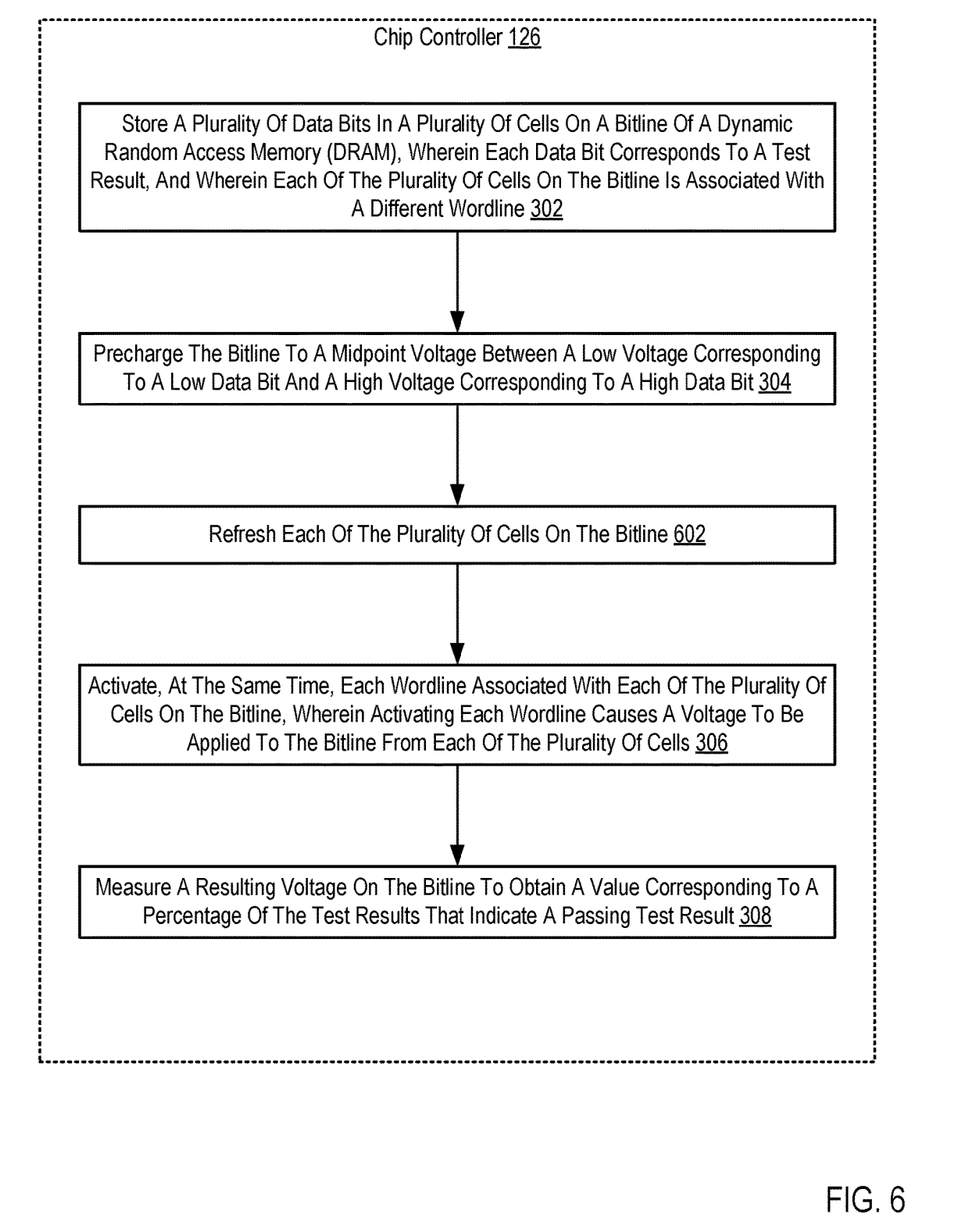
FIG. 6 sets forth a flow chart illustrating an exemplary method for big data analysis using low power circuit design according to embodiments of the present invention.

For further explanation, FIG. 6 sets forth a flow chart illustrating an exemplary method for big data analysis using low power circuit design according to embodiments of the present invention that includes storing (302) a plurality of data bits in a plurality of cells on a bitline of a dynamic random access memory (DRAM), wherein each data bit corresponds to a test result, and wherein each of the plurality of cells on the bitline is associated with a different wordline; precharging (304) the bitline to a midpoint voltage between a low voltage corresponding to a low data bit and a high voltage corresponding to a high data bit; activating (306), at the same time, each wordline associated with each of the plurality of cells on the bitline, wherein activating each wordline causes a voltage to be applied to the bitline from each of the plurality of cells; and measuring (308) a resulting voltage on the bitline to obtain a value corresponding to a percentage of the test results that indicate a passing test result.

The method of FIG. 6 differs from the method of FIG. 3, however, in that FIG. 6 includes refreshing (602) each of the plurality of cells on the bitline. Refreshing (602) each of the plurality of cells on the bitline may be carried out by adding voltage to some or all of the memory cells to maintain enough voltage within the memory cells to accurately reflect the value originally stored. The voltage within memory cells in DRAM may degrade over time. If the voltage degrades beyond a certain point, a data bit stored as a "1" in a memory cell may be read as a "0" due to degradation. Refreshing (602) each of the plurality of cells on the bitline may be performed to insure accuracy in measuring the percent correlated voltage. Refreshing (602) each of the plurality of cells on the bitline may prevent misreads in the event that the amount of time necessary for storing all test results in each of the memory cells is significant enough to cause degradation.

Figure 7:
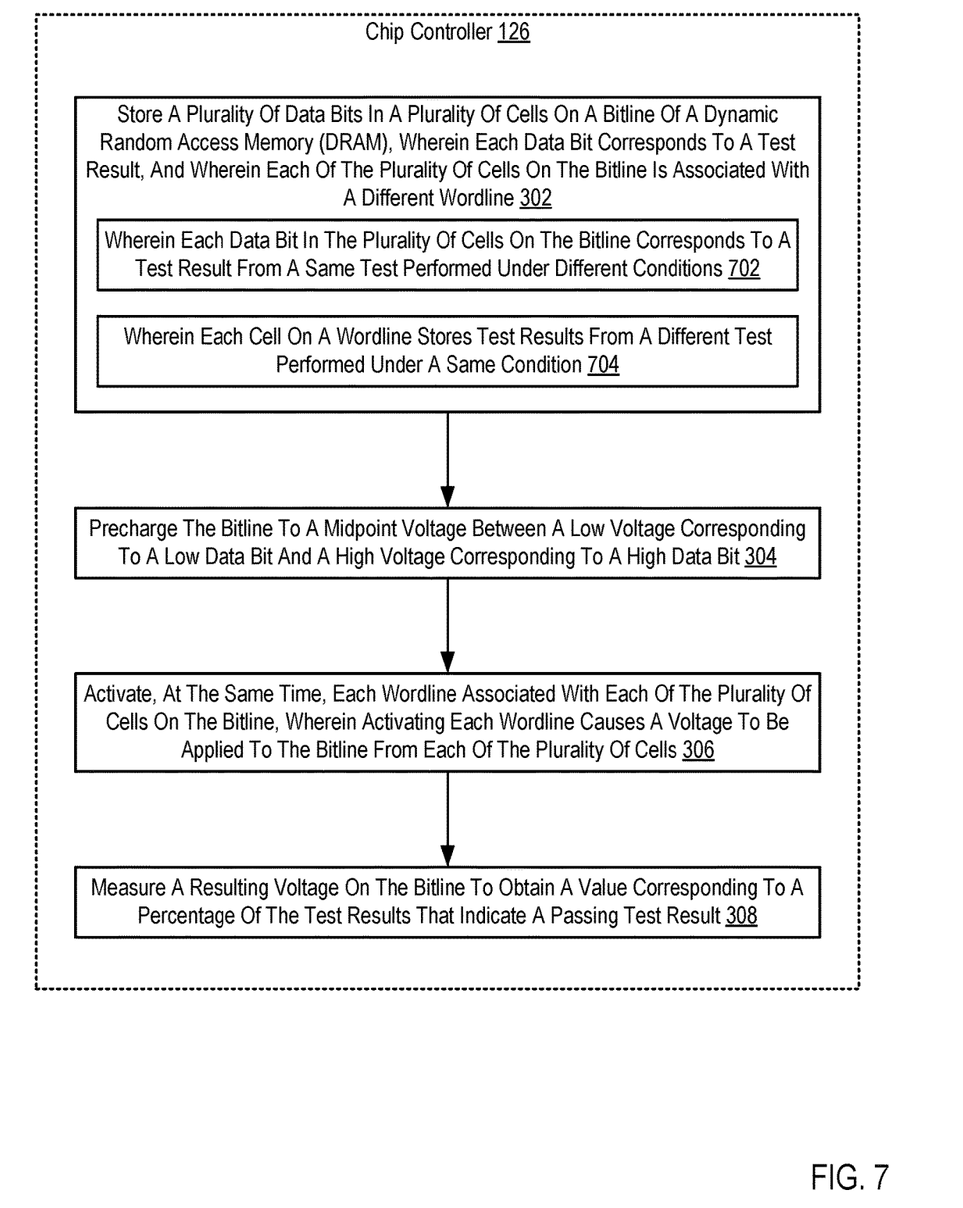
FIG. 7 sets forth a flow chart illustrating an exemplary method for big data analysis using low power circuit design according to embodiments of the present invention.

For further explanation, FIG. 7 sets forth a flow chart illustrating an exemplary method for big data analysis using low power circuit design according to embodiments of the present invention that includes storing (302) a plurality of data bits in a plurality of cells on a bitline of a dynamic random access memory (DRAM), wherein each data bit corresponds to a test result, and wherein each of the plurality of cells on the bitline is associated with a different wordline; precharging (304) the bitline to a midpoint voltage between a low voltage corresponding to a low data bit and a high voltage corresponding to a high data bit; activating (306), at the same time, each wordline associated with each of the plurality of cells on the bitline, wherein activating each wordline causes a voltage to be applied to the bitline from each of the plurality of cells; and measuring (308) a resulting voltage on the bitline to obtain a value corresponding to a percentage of the test results that indicate a passing test result.

The method of FIG. 7 differs from the method of FIG. 3, however, in that FIG. 7 includes wherein (702) each data bit in the plurality of cells on the bitline corresponds to a test result from a same test performed under different conditions; and wherein (704) each cell on a wordline stores test results from a different test performed under a same condition. The same conditions may include tests performed on the same environment, such as the same computer chip or die, and different conditions may include tests performed on different environments, such as different computer chips or dies.

For example, the DRAM may be configured to quickly and efficiently evaluate test results from chip yields. A set of tests may be performed on a group of non-yielding computer chips to determine which elements within the chips may have resulted in the chips overall failure. The set of test results for one non-yielding chip may be stored in a set of memory cells on the same wordline. The next set of test results for the next non-yielding chip may be stored in a set of memory cells on the next wordline, and so forth. Once a complete set of test results for a group of non-yielding chips has been stored in the DRAM, each bitline is precharged and each wordline is activated. The resulting voltage on each bitline is read to determine the percentage of passing tests for each test performed on the set of chips.

In view of the explanations set forth above, readers will recognize that the benefits of big data analysis using low power circuit design according to embodiments of the present invention include:

Improving the operation of a computer system by utilizing the features of DRAM to perform near-real-time analysis of test results that is orders of magnitude more efficient than traditional methods and requires less time.

Improving the operation of a computer system by modifying DRAM to quickly and efficiently evaluate large amounts of data to approximate trends and flag anomalies, increasing data evaluation efficiency.

Exemplary embodiments of the present invention are described largely in the context of a fully functional computer system for big data analysis using low power circuit design. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method comprising:
   storing a plurality of data bits in a plurality of cells on a bitline of a dynamic random access memory (DRAM), wherein each data bit corresponds to a test result, wherein each test result consists of one of a passing test result or a failing test result, and wherein each of the plurality of cells on the bitline is associated with a different wordline;
   precharging the bitline to a midpoint voltage between a low voltage corresponding to a low data bit and a high voltage corresponding to a high data bit;
   activating, at the same time, each wordline associated with each of the plurality of cells on the bitline, wherein activating each wordline causes a voltage to be applied to the bitline from each of the plurality of cells wherein activating, at the same time, each wordline associated with each of the plurality of cells on the bitline comprises:
      activating a special correlation function comprising logic configured to activate all connected wordlines simultaneously and cause each memory cell on a bitline to apply a voltage to the bitline, the special correlation function operatively coupled to each wordline associated with each of the plurality of cells on the bitline; and
   measuring a resulting voltage between the low voltage and the high voltage on the bitline to obtain a value corresponding to a percentage of the test results that indicate a passing test result; wherein each data bit in the plurality of cells on the bitline corresponds to a test result from a same test performed under different conditions;
   wherein measuring the resulting voltage on the bitline to obtain the value corresponding to the percentage of the test results that indicate a passing test result comprises:
      applying the resulting voltage to a correlation unit comprising an analog-to-digital converter; and
      activating, based on the resulting voltage, a correlation factor indicating the percentage of passing test results.

2. The method of claim 1, wherein the correlation unit comprises a plurality of correlation factors, and wherein activating, based on the resulting voltage, the correlation factor indicating the percentage of passing test results comprises activating at least two correlation factors of the plurality of correlation factors indicating the percentage of passing test results.

3. The method of claim 1, wherein activating the special correlation function transmits a high signal to an OR gate attached to each wordline associated with each of the plurality of cells on the bitline.

4. The method of claim 1, wherein each of the plurality of cells on the bitline is refreshed prior to activating each wordline associated with each of the plurality of cells on the bitline.

5. The method of claim 1, wherein each cell on a wordline stores test results from a different test performed under a same condition.

6. An apparatus comprising a computer processor, a computer memory operatively coupled to the computer processor, wherein computer program instructions are stored within the computer memory and the computer program instructions, when executed by the computer processor, cause the apparatus to carry out the steps of:
   storing a plurality of data bits in a plurality of cells on a bitline of a dynamic random access memory (DRAM), wherein each data bit corresponds to a test result, wherein each test result consists of one of a passing test result or a failing test result, and wherein each of the plurality of cells on the bitline is associated with a different wordline;
   precharging the bitline to a midpoint voltage between a low voltage corresponding to a low data bit and a high voltage corresponding to a high data bit;
   activating, at the same time, each wordline associated with each of the plurality of cells on the bitline, wherein activating each wordline causes a voltage to be applied to the bitline from each of the plurality of cells, wherein activating, at the same time, each wordline associated with each of the plurality of cells on the bitline comprises:
      activating a special correlation function comprising logic configured to activate all connected wordlines simultaneously and cause each memory cell on a bitline to apply a voltage to the bitline, the special correlation function operatively coupled to each wordline associated with each of the plurality of cells on the bitline; and measuring a resulting voltage between the low voltage and the high voltage on the bitline to obtain a value corresponding to a percentage of the test results that indicate a passing test result; wherein each data bit in the plurality of cells on the bitline corresponds to a test result from a same test performed under different conditions;

wherein measuring the resulting voltage on the bitline to obtain the value corresponding to the percentage of the test results that indicate a passing test result comprises:

applying the resulting voltage to a correlation unit comprising an analog-to-digital converter; and activating, based on the resulting voltage, a correlation factor indicating the percentage of passing test results.

7. The apparatus of claim 6, wherein the correlation unit comprises a plurality of correlation factors, and wherein activating, based on the resulting voltage, the correlation factor indicating the percentage of passing test results comprises activating at least two correlation factors of the plurality of correlation factors indicating the percentage of passing test results.

8. The apparatus of claim 6, wherein activating the special correlation function transmits a high signal to an OR gate attached to each wordline associated with each of the plurality of cells on the bitline.

9. The apparatus of claim 6, wherein each of the plurality of cells on the bitline is refreshed prior to activating each wordline associated with each of the plurality of cells on the bitline.

10. The apparatus of claim 6, wherein each cell on a wordline stores test results from a different test performed under a same condition.

11. A non-transitory computer readable medium comprising computer program instructions that, when executed, cause a computer to carry out the steps of:

storing a plurality of data bits in a plurality of cells on a bitline of a dynamic random access memory (DRAM), wherein each data bit corresponds to a test result, wherein each test result consists of one of a passing test result or a failing test result, and wherein each of the plurality of cells on the bitline is associated with a different wordline;

precharging the bitline to a midpoint voltage between a low voltage corresponding to a low data bit and a high voltage corresponding to a high data bit;

activating, at the same time, each wordline associated with each of the plurality of cells on the bitline, wherein activating each wordline causes a voltage to be applied to the bitline from each of the plurality of cells, wherein activating, at the same time, each wordline associated with each of the plurality of cells on the bitline comprises:

activating a special correlation function comprising logic configured to activate all connected wordlines simultaneously and cause each memory cell on a bitline to apply a voltage to the bitline, the special correlation function operatively coupled to each wordline associated with each of the plurality of cells on the bitline; and measuring a resulting voltage between the low voltage and the high voltage on the bitline to obtain a value corresponding to a percentage of the test results that indicate a passing test result; wherein each data bit in the plurality of cells on the bitline corresponds to a test result from a same test performed under different conditions;

wherein measuring the resulting voltage on the bitline to obtain the value corresponding to the percentage of the test results that indicate a passing test result comprises:

applying the resulting voltage to a correlation unit comprising an analog-to-digital converter; and activating, based on the resulting voltage, a correlation factor indicating the percentage of passing test results.

12. The non-transitory computer readable medium of claim 11, wherein the correlation unit comprises a plurality of correlation factors, and wherein activating, based on the resulting voltage, the correlation factor indicating the percentage of passing test results comprises activating at least two correlation factors of the plurality of correlation factors indicating the percentage of passing test results.

13. The non-transitory computer readable medium of claim 11, wherein activating the special correlation function transmits a high signal to an OR gate attached to each wordline associated with each of the plurality of cells on the bitline.

14. The non-transitory computer readable medium of claim 11, wherein each of the plurality of cells on the bitline is refreshed prior to activating each wordline associated with each of the plurality of cells on the bitline.

15. The non-transitory computer readable medium of claim 11, wherein each cell on a wordline stores test results from a different test performed under a same condition.

* * * * *